US009834849B2

(12) United States Patent
Sammelselg et al.

(10) Patent No.: US 9,834,849 B2
(45) Date of Patent: Dec. 5, 2017

(54) METHOD OF PREPARING CORROSION RESISTANT COATINGS

(71) Applicant: University of Tartu, Tartu (EE)

(72) Inventors: Vaino Sammelselg, Tartu (EE); Lauri Aarik, Tartu (EE); Maido Merisalu, Tartu (EE)

(73) Assignee: University of Tartu, Tartu (EE)

( * ) Notice: Subject to any disclaimer, the term of this patent is extended or adjusted under 35 U.S.C. 154(b) by 149 days.

(21) Appl. No.: 14/758,280

(22) PCT Filed: Dec. 31, 2013

(86) PCT No.: PCT/IB2013/061447
§ 371 (c)(1),
(2) Date: Jun. 29, 2015

(87) PCT Pub. No.: WO2014/102758
PCT Pub. Date: Jul. 3, 2014

(65) Prior Publication Data
US 2015/0368822 A1    Dec. 24, 2015

(30) Foreign Application Priority Data
Dec. 31, 2012    (GB) .................................. 1223532.1

(51) Int. Cl.
*C23C 16/00*    (2006.01)
*C25D 5/48*    (2006.01)
(Continued)

(52) U.S. Cl.
CPC .......... *C25D 5/48* (2013.01); *C23C 16/45527* (2013.01); *C23C 16/48* (2013.01);
(Continued)

(58) Field of Classification Search
CPC ........ C25D 5/48; C25D 11/024; C25D 11/06; C25D 11/18; C23C 16/45527; C23C 16/48; C23C 16/50; C23C 28/072; C23C 28/046
See application file for complete search history.

(56) References Cited

U.S. PATENT DOCUMENTS 8,119,273 B1 *    2/2012    Gerald, II ............ C25D 11/045
29/623.5
2007/0125702 A1 *    6/2007    Ramaswamy ..... B01D 67/0062
210/490
(Continued)

FOREIGN PATENT DOCUMENTS

EP    1894578    2/2008
WO    PCT/IB2013/061447    5/2014

OTHER PUBLICATIONS

Comstock, David et al.; Synthesis of nanoporous activated iridium oxide films by anodized aluminum oxide templated atomic layer deposition; Electrochemical Communications; Aug. 31, 2010; vol. 12, pp. 1543-1546.
Narayan, Roger; Atomic Layer Deposition of TiO2 Thin Films on Nanoporous Alumina Templates: Medical Applications; Thin Films and Interlaces; Jun. 2009; vol. 61 No. 6, pp. 12-14.
Narayan, Roger; Smarter implants; Materials Today; Apr. 2009; vol. 12, p. 10.

*Primary Examiner* — Kelly M Gambetta
(74) *Attorney, Agent, or Firm* — Spruce Law Group, LLC

(57) ABSTRACT

A method for preparing thin double-structured composite corrosion resistant and/or passivating coatings that consist of a thin metal oxide-hydroxide subcoating prepared by anodizing the metal substrate materials near-surface part and then provided with an atomic layer deposition (ALD) topmost nanocoating, of e.g. oxide, nitride, carbonate, carbide etc. or their mixes or laminates, or laminates with ceramic and metallic layers, or laminates with inorganic or organic polymers and ceramic layers.

15 Claims, 7 Drawing Sheets

(51) Int. Cl.
    *C25D 11/02*     (2006.01)
    *C25D 11/06*     (2006.01)
    *C25D 11/18*     (2006.01)
    *C23C 28/04*     (2006.01)
    *C23C 16/455*    (2006.01)
    *C23C 16/48*     (2006.01)
    *C23C 16/50*     (2006.01)

(52) U.S. Cl.
    CPC ............ *C23C 16/50* (2013.01); *C23C 28/042* (2013.01); *C23C 28/046* (2013.01); *C25D 11/024* (2013.01); *C25D 11/06* (2013.01); *C25D 11/18* (2013.01); *Y10T 428/24997* (2015.04)

(56) References Cited

U.S. PATENT DOCUMENTS

| | | | |
|---|---|---|---|
| 2011/0310530 A1* | 12/2011 | Laor | H01G 4/33<br>361/524 |
| 2012/0034410 A1* | 2/2012 | Baumgart | B01D 61/427<br>428/80 |
| 2013/0171418 A1* | 7/2013 | Mardilovich | B81C 1/00031<br>428/166 |
| 2013/0177738 A1* | 7/2013 | Mardilovich | B81C 1/00031<br>428/141 |

\* cited by examiner

METHOD OF PREPARING CORROSION RESISTANT COATINGS

BACKGROUND

Technical Field

The present invention is related to thin double-structured composite anti-corrosion coatings and to a method of preparing such anti-corrosion submicrometer thickness coatings for metal surfaces, in particular for application to anodizable metals.

Background Art

Corrosion resistant or anti-corrosion coatings find application in many industries, in particular in: a) aero-space industry, b) car-industry, and c) medical implants and instruments producing industries. Other applications include: metal industry producing equipment, tools and aid for chemical and food industries, for (sustainable) energetics, for building industry, etc.

It is desirable for such coatings to be hard, to protect the substrate and also elastic, for example so that the coating does not flake off.

In the state of the art U.S. Pat. No. 7,323,230 B2 "Coating for aluminum component" by T T Doan, K K-T Ngan (Applied Materials, Inc.), priority date Feb. 2, 2006 describes a method consisting principally of three stages: a) anodizing the substrate, b) Chemical Vapour Deposition (CVD) deposition of Al film and c) "re-flow the Al film", oxidation of aluminum and deposition of alumina to the anodized layer; stages b and c together give a CVD-like process; they claim also equipment for the topmost alumina coating.

Another technical solution is described in United Kingdom Patent GB2455993 "Article coated by ALD and CVD/PVD", by P. Peeters, R. Tietema (Hauzer Techno Coating; CORRAL partner), priority date Dec. 28, 2007. This patent claims 2-layer coating done by ALD and CVD/PVD (Physical Vapour Deposition) in arbitrary order, and equipment for that. The technical object of said 2-layer coating is to provide a way of protecting articles having PVD or CVD layer from the effect of poor adhesion and/or corrosion and retaining the positive physical benefits of named layers such as high hardness, high resistance to wear, low coefficient of friction etc. In addition, the object of said 2-layer coating is to facilitate giving a coated article a desired coloured appearance when illuminated. However, when the first coating layer is made by ALD this layer, and therefore the whole coating, has poor adhesion. If the first layer is made by PVD/CVD then the first layer must be several micrometers or thicker to obtain a low-density of defects in the layer, and to screen electrically the influence of electrochemically active phases in near-surface area of the article to prevent localized galvanic corrosion.

SUMMARY OF INVENTION

An embodiment of the invention provides a metal article having a protective coating formed on its surface for preventing corrosion of the metal article, wherein the coating is double-structured, such that the coating has a homogeneous base part, formed of an anodising layer on the surface of the metal article under conditions that inhibit the formation of pores and encourage near surface structure, wherein the pores formed by anodising are irregular tortuous branched cracks that reach through to the underlying metal, the protective coating further comprising at least one nano-layer of another atomic species deposited using atomic layer deposition (ALD), said atomic species being one which is not corroded by materials that would corrode the underlying metal article, and said layer coating the entire surface of the anodised layer including the walls of the irregular branched pores but without closing or corking the pores in the anodised layer, wherein the near surface structure provides a surface for the top layer to adhere to.

The present invention provides a novel thin double-structured composite anti-corrosion coating the base sublayer of which consists of metal oxide(s) and hydroxide(s), is homogeneous, dense and has low concentration of pores and cracks, thus, is relatively hard. Also, as the layer has submicrometer thickness, the coating has certain mechanical flexibility as well. As the sublayer is formed by anodizing the substrate it is excellently adhered to the substrate. The top part of the composite consists of one or more nanolayers with total thickness of some tens of nanometers, is strongly bonded to the base layer and covers that layer uniformly, which makes the coating fully defect free. The ALD deposited layer has a total thickness of less than 100 manometers. The top part is made from chemically resistive material(s) making the whole coating chemically resistive.

The present invention provides also a method of preparing a corrosion resistant coating on a metallic substrate forming a coating on a metal article, wherein the coating is for protecting the underlying metal article against materials that are corrosive to the metal, the method comprising the steps of:

a) anodizing the surface of the substrate metal article by applying a voltage to the metal article, wherein the voltage parameters used for anodisation are selected to homogenise the surface layer and to provide a thickness which allows flexiblity of the and thick to prevent diffusion, to produce a subcoating on the substrate, by performing the anodizing step in two stages, a first anodizing stage where an electric potential as measured against a saturated calomel electrode is applied to the substrate for homogenization of the surface layer, so that a homogeneous subsurface layer of metal oxide is formed and the near surface laying inclusions of other phases are dissolved or removed, and a second anodizing stage where the potential is then applied to the substrate to form a protective sublayer which is well adhered to the metal surface and if prepared as dense material has high hardness and resistance to wear, wherein the potential during the first anodizing stage may be varied according to a first voltage profile, which may include an increasing potential between 0 and 2 Volts, wherein the potential during the second potentiodynamic anodizing stage is varied according to a second voltage profile, which includes an increasing potential between 0 and 20 Volts, wherein the pores are irregular tortuous branched cracks that reach through to the underlying metal article, b) performing depositing by atomic layer deposition (ALD) a second material which is not corroded by materials that would corrode the underlying metal article, on the anodized subcoating to add a top-layer to the substrate anodised layer such that the entire surface is covered by the second material including the walls of the irregular branched pores but without closing or corking the pore's openings to protect from dissolving the underlying anodised layer by preventing materials that would otherwise corrode the underlying metal article from reaching the underlying metal article.

This produces a thin coating, which does not substantially add to the dimensions of the article that is being coated. The anodizing step removes also active, corrosion forming sites from the surface and provides a coating with hardness and flexibility, while the ALD step seals/fills the pores and other defects in the anodized coating, thereby seals the whole surface, preventing entry of corrosion causing materials. The ALD-made top part is made from chemically more resistive material(s) than anodized sublayer, thereby it also betters the corrosion resistivity of the coating. Also during the anodizing process a nanostructured surface is formed that increases the adhesion of the following ALD film(s), see FIG. 2.

For confirmation, a voltage is measured with reference to ground whereas potential is measured between two objects in the same system.

However, a voltage profile refers to the change in potential between two objects. The potential during the second potentiodynamic anodizing stage is varied according to a second voltage profile, which may include an increasing the potential between 0 and 20 Volts. The anodizing stages may be carried out using cyclic voltammetry, including the use of a three-electrode bath, see FIG. 3. During the cleaning and forming processes, the maximum value of the electric potential with reference to the saturated calomel electrode is increased in the every following step until the surface of the article is anodized with necessary thickness and that sublayer is chemically homogeneous. It is also determined by the choice of the maximum potential in the final anodizing step that the anodized sublayer thickness is lower than 1 micrometer to avoid critical stresses in the coating that could cause cracking the anodized sublayer during the following ALO process or during sample exploitation; see cracking of too thick anodized layer in FIG. 4.

The acids used for the anodizing may include inorganic and/or organic acids including, but not limited with, sulphuric, boric, phosphoric, tartaric, oxalic acids and/or mixtures of said acids in water or any other suitable liquid.

The substrate may be cleaned prior to anodizing, by grinding or brushing the surface of the substrate, by ultrasound treatment or by grinding or brushing followed by ultrasound treatment to remove loosely connected particles as well as flake-like particles.

The atomic layer deposition process may be performed in a suitable system and the method may include exposing the substrate to a first precursor gas, purging the first precursor gas from the system, exposing the substrate to a second precursor gas and purging the second precursor gas from the system and maintaining the substrate at a temperature below the temperature at which the mechanical properties of the substrate are changed. The substrate may be exposed to the precursor gases for periods in the range 0.01 seconds to 300 seconds. The system may be purged of precursor gases for periods in the range 0.01 seconds to 500 seconds. These timings may be longer for special applications, for the first precursor, for the purge, for the second precursor and purge, respectively, at gas pressures and flow rate values that ensure stable growth of the atomic layer film(s) into the walls of the pores and cracks in their whole length of the anodized layer of the article surface.

Additional reaction activators may be used in the ALD process, including plasma, light/radiation, any physical field or temperature variation for sealing the anodized subcoating with at least one film coating for example, but not limited with, oxides, nitrides, carbonates, carbides or their mixes or laminates, laminates with ceramic and metallic layers, laminates with inorganic or organic polymers and ceramic layers, having also the necessary hardness, elasticity and chemical resistivity.

The substrate may be any metallic article capable of being anodized, for example, but not limited with, aluminum, magnesium, titanium, vanadium, zinc, niobium, cadmium, hafnium, tantalum or their alloys or their alloys.

In an embodiment, an article is provided having a coating formed by the method described above.

In an embodiment there is a method for preparing thin composite coatings that consist of a thin metal oxide-hydroxide subcoating prepared by anodizing the substrate materials near-surface part and then provided with an atomic layer deposition (ALD) topmost thin coating, of e.g. oxide, nitride, carbonate, carbide etc. or their mixes or laminates, of laminates with ceramic and metallic layers, of laminates with inorganic or organic polymers and ceramic layers.

A combined method for preparation of a thin composite anti-corrosion coating for an anodizing metal/alloy article with comprising the steps of:

a) applying first anodizing process step to non-dirty surface of the article for further cleaning and homogenization of it, whereas loosely connected particles as well as flake-like particles, and small inclusions of chemically stable but electrochemically active phases lying in very surface area of the article are removed, b) applying second anodizing process step to the surface of the article a protective sublayer of necessary thickness, density and homogeneity, and a surface nanostructure are formed, and thereafter, c) applying the atomic layer deposition process to the anodized subcoating for adding a top layer with better chemical resistivity and as sealer of pores and cracks, thus improving and finishing the anti-corrosion coating.

In the proposed method, the anodizing process of the article's near-surface material is carried out by using voltammetry in at least two steps where in the first step potentials in the range of 0-2 volts and in the second step potentials in range of 0-20 volts are used. During the cleaning and forming process the potential maximum value is increased in the every following step until the surface of the article is anodized with necessary thickness and that sublayer is chemically homogeneous. For controlling the anodizing potential precisely, a three-electrode anodizing bath is used, see FIG. 3.

In the anodizing process the electrolytes solutions of 0.1-80% of inorganic and/or organic acids, and/or their mixes are used that allowing a dense and low-defective anodized layer to form.

The inorganic and/or organic acids used in cleaning and homogenization processes are e.g., but not limited with, sulphuric, boric, phosphoric, tartaric, oxalic acids and/or of their mixes in water or any other suitable liquid.

The ALD process for improving and finishing the topmost part of the coating of the article surface is carried out a) at the temperatures not exceeding values that worsen the mechanical properties during special thermal treatment(s) of the metallic articles, e.g. ≤160° C. for certain Al-alloys, b) with the growth pulsing times in the ranges (0.01-300)-(0.01-500)-(0.01-300)-(0.01-500) s, or longer for special applications, for the first precursor, for the purge, for the second precursor and purge, respectively, for gas pressure and flow rate values that ensure stable growth of the atomic layer film(s) into the walls of the pores in their whole length of the anodized layer of the article surface, c) by using suitable ALD precursors and by necessity additional reaction activators.

The activators are, e.g. but not limited with, plasma, light/radiation, electrical/magnetic fields, allowing to obtain a sealing subcoating with films/laminates consisting of chemically resistive enough material(s) like, but not limited with, oxides, nitrides, carbonates, carbides or their mixes or laminates, laminates with ceramic and metallic layers, laminates with inorganic or organic polymers/molecular-layers and ceramic layers having also necessary hardness and elasticity.

The object of the present invention is a novel double-structured composite material for thin anti-corrosion (corrosion preventing) coatings for anodizing metals and articles, e.g., but not limited, aluminum, magnesium, titanium, vanadium, zinc, niobium, cadmium, hafnium, tantalum etc. and their alloys, and the preparation method of same.

A further object of the present inventions is a method for the anti-corrosion coatings for metal, in particular the invention relates to a method of thin anti-corrosion (corrosion preventing) coatings for anodizing metals by anodizing the article surface, homogenization of the near-surface area by removing during the anodizing process the inclusions of electrochemically active phases (consisting of chemically more passive elements than article main elements), following atomic layer deposition (ALD) of an upper-layer on the surface of the metal, e.g., but not limited with, aluminum, magnesium, titanium, vanadium, zinc, niobium, cadmium, hafnium, tantalum, etc. and their alloys.

The method and coatings according to present invention are based on double-structured composition materials that consist of a submicrometer thick metal oxide-hydroxide sub-layer prepared by anodizing the article thin near-surface part, during which process also homogenization of that layer is made so that it does not consist of inclusions of electrochemically active phases, and of prepared with ALD thin chemically resistive top coating, e.g. of, but not limited, oxide, nitride, carbonate, carbide, etc. or their mixes or laminates, of laminates with ceramic and metallic layers, of laminates with inorganic and/or organic polymers and ceramic layers. The whole thickness of the coatings does not exceed one micrometer, supporting reaching necessary hardness and elasticity of the coatings and at the same time allowing using them for coating the details needed to maintain their exact dimensions. The method enables with the topmost nanometric ALD layer to seal and passivate the walls and bottoms of the pores that can exist in the anodized sublayer and that can reach the metallic substrate, thus covers the surfaces of the pores and cracks down to the bottom with a thin protective layer without closing or corking the pores and cracks of the anodized material; see FIG. 5.

The substrate anodizing process is needed for the following reasons. Firstly, during the process the article surface is cleaned and formed: loosely connected particles and flake-like parts are removed from the surface. Secondly, with the anodizing process a homogeneous subsurface layer of metal oxide is formed as the near surface laying inclusions of other phases are dissolved or removed. Thirdly, a sublayer formed by anodizing is well adhered to the metal surface and if prepared as dense material has high hardness and low wearability. Fourthly, during the anodizing process a nanostructured surface is formed that increases adhesion of the following ALD film(s), see FIGS. 6-7. The proposed use of three-electrode bath for carrying out the anodizing process allows more exact drive and control of the process than traditional two-electrode electrochemical bath does.

BRIEF DESCRIPTION OF DRAWINGS

The method for anti-corrosion or corrosion preventing coatings for metals will be described in detail below with reference to the drawings where.

DESCRIPTION OF EMBODIMENTS

Figure 1:
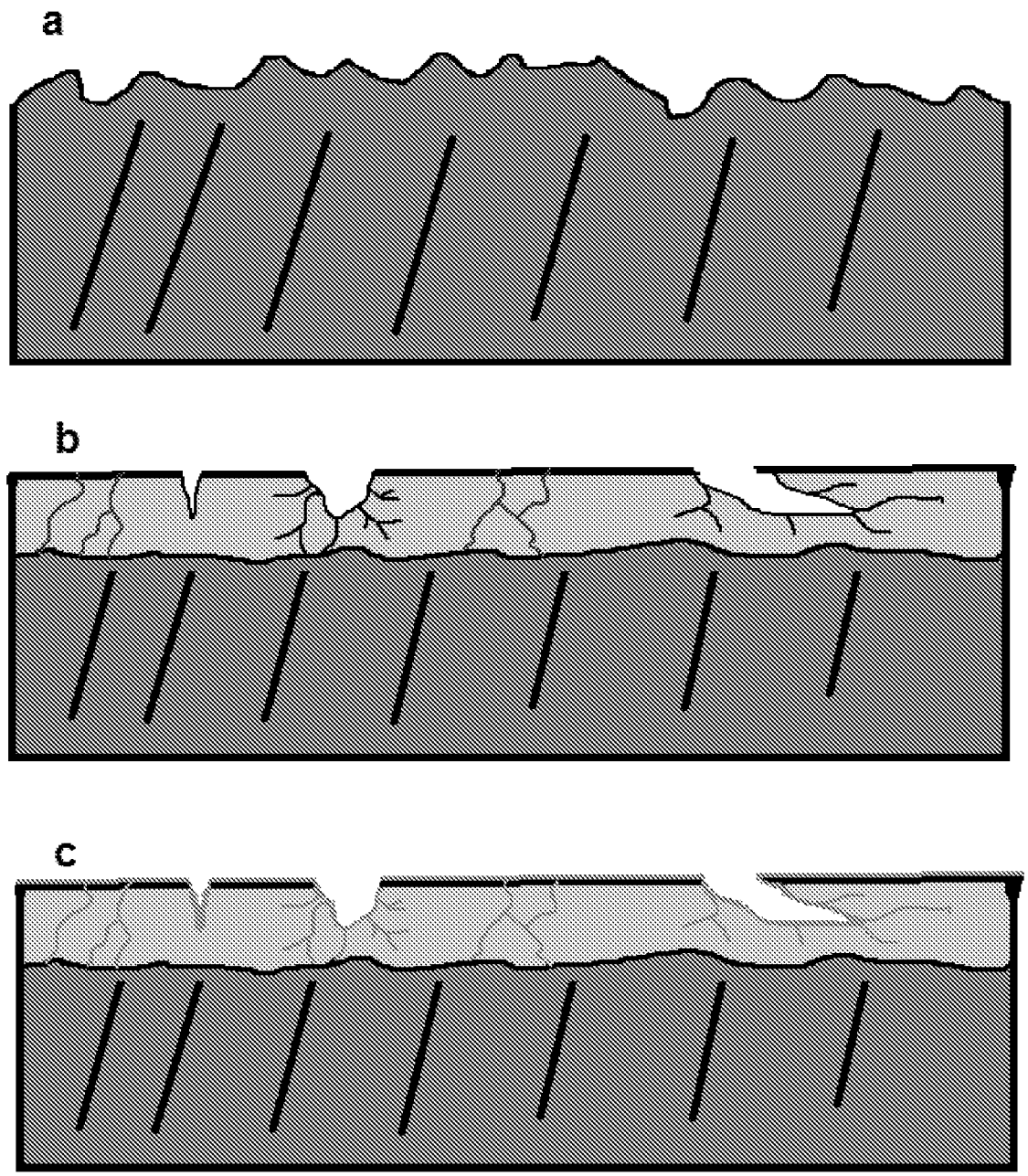
FIG. 1 shows a scheme of composite coating preparation stages where: a) is initial substrate surface, b) is the surface after anodizing and c) is the surface after finishing with ALD.
Figure 2:
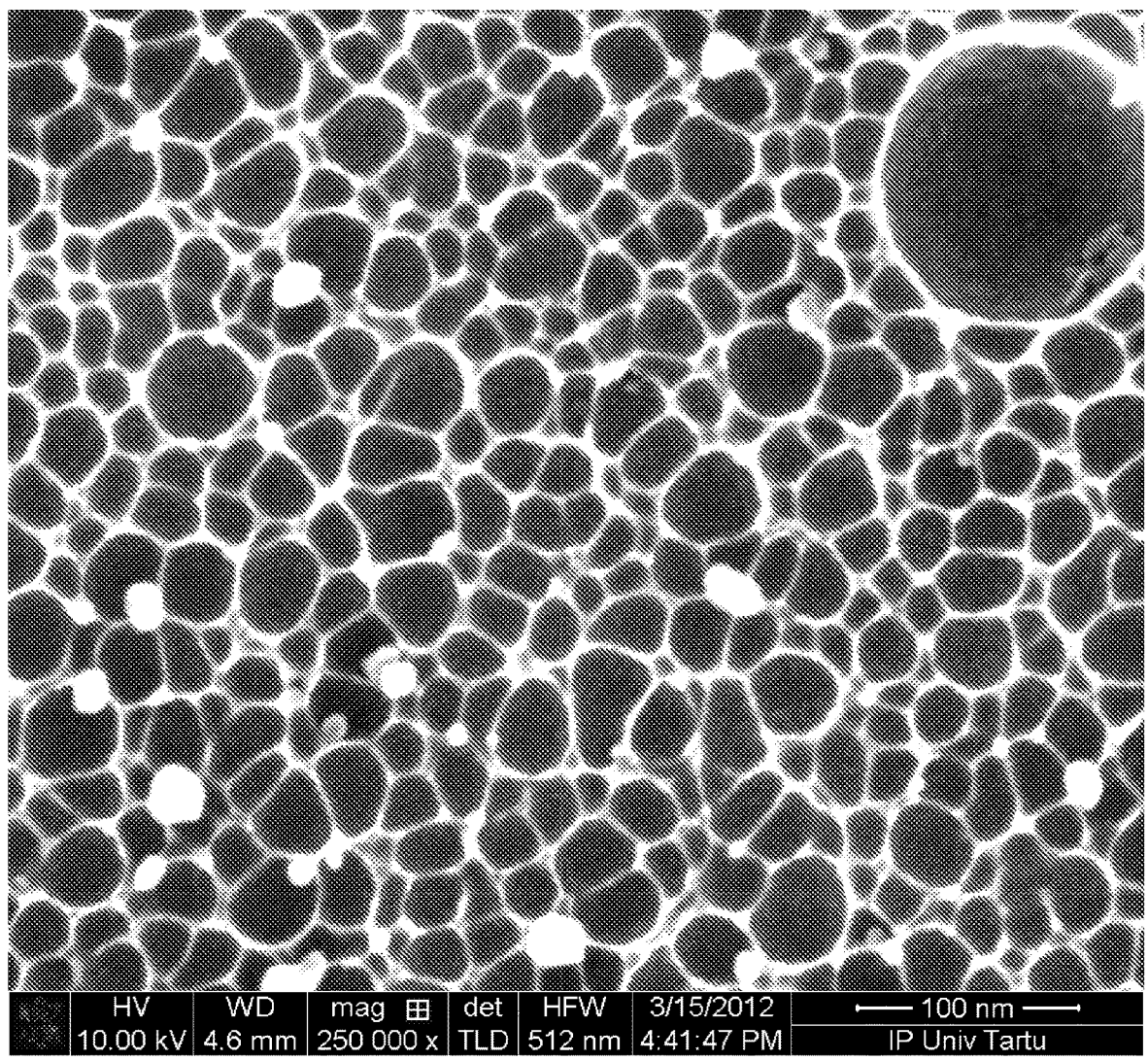
FIG. 2 shows the nanostructured surface of an anodized article.

The method and coatings according to present invention are based on double-structured composition materials that consist of a thin metal oxide-hydroxide sub-layer prepared by anodizing the substrate materials thin near-surface part and of prepared with atomic layer deposition (ALD) topmost thin ceramic coating, of e.g. oxide, nitride, carbonate, carbide, apatite etc. or their mixes or laminates, of laminates with ceramic and metallic layers, of laminates with inorganic and/or organic polymers and ceramic layers.

The whole coating is thin, its thickness does not exceed one micrometer, so that the coatings have the hardness and elasticity and at the same time allowing the details of the article that has been coated to maintain their exact dimensions; thick coatings can alter the shape of the article that has been coated. In addition the coating can be used also for thin, up to several micrometers thickness metal sheets, or to the articles consisting thin sheet parts, as the anodized sublayer is relatively thin (and can be made even thinner than 0.1 um if the substrate is chemically homogeneous), and therefore does not change substantially the sheet mechanical and other properties, which is not the case for other coatings based on anodized (sub)layers several micrometers thick.

The combined method comprises first, step-wise anodizing: the first step is substrate anodizing where during the anodizing process the substrate (metal article) surface is cleaned and homogenized so that the loosely connected particles and flake-like parts, as well as unwanted adsorbents are removed. The anodizing process of the substrate's near-surface layer is applied by using cyclic voltammetry in two or more steps, e.g. by applying potentials in the range of 0-2 volts in first step and of 0-20 volts in second step, and increased potential maximum value in every next step, until the surface is clean and chemically homogeneous enough. In the first step the potential is scanned between 0 and up to 2 volts, at a rate between 1 and 50 mV/s, for 1 to 50 cycles. This generates the first layer on top of the metal surface and the formation of this layer can be observed in a laboratory environment via a potentiostat. In industrial applications, the process needs only to be calibrated. The second step of the process can follow as soon as the desired parameters for the first are achieved. In this step, the potential is increased and the scan is performed between 0 and 20 V (depending on the anodizing solution) at a rate between 100 and 1000 mV/s for 1 to 100 cycles, depending on how thick a layer is required and the properties of the substrate material.

As electrolytes solutions of 0.1-80% of inorganic and/or organic acids, e.g. but not limited of sulphuric, boric, phosphoric, tartaric, oxalic, etc. acids, and of their mixes in water, or any other suitable liquid, are used. The acid concentration range is dependent on the acid used and the material to be anodized. Some material-acid combinations work well below 1% concentration, some need over 50%. The temperature of the solution is important as this serves to suppress the formation of hydroxides during anodizing. The preferred temperature range is between −10 and 50° C. and it would again depend on both the material to be treated and the solution used.

Figure 3:
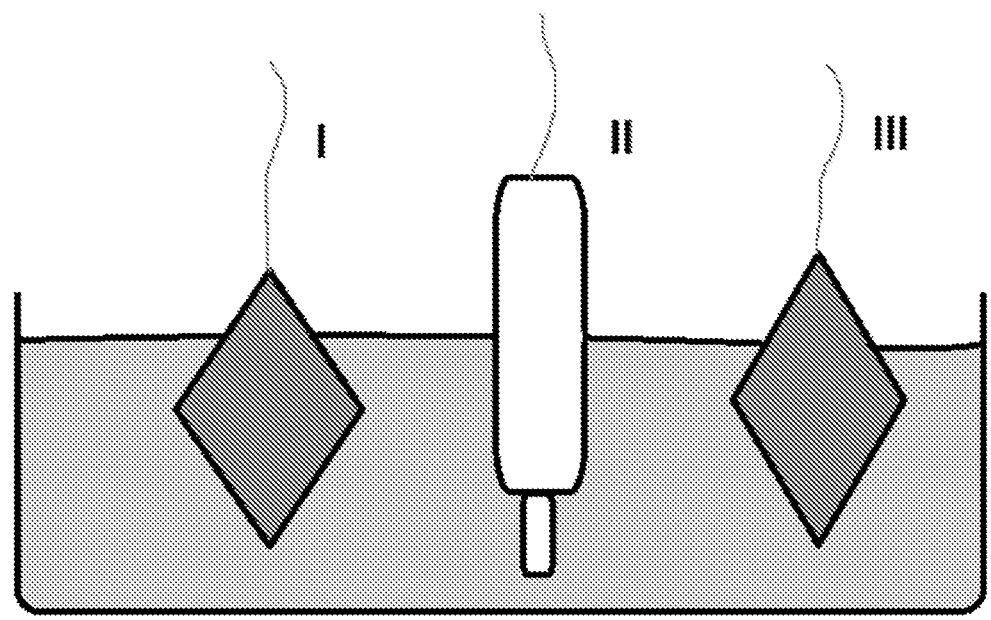
FIG. 3 shows a scheme of 3-electrodes anodizing bath for anodizing the metal surface before ALD coating, with: 1—reference electrode (absent in two-electrode baths), 2—working electrode (the article), 3—counter electrode.
Figure 4:
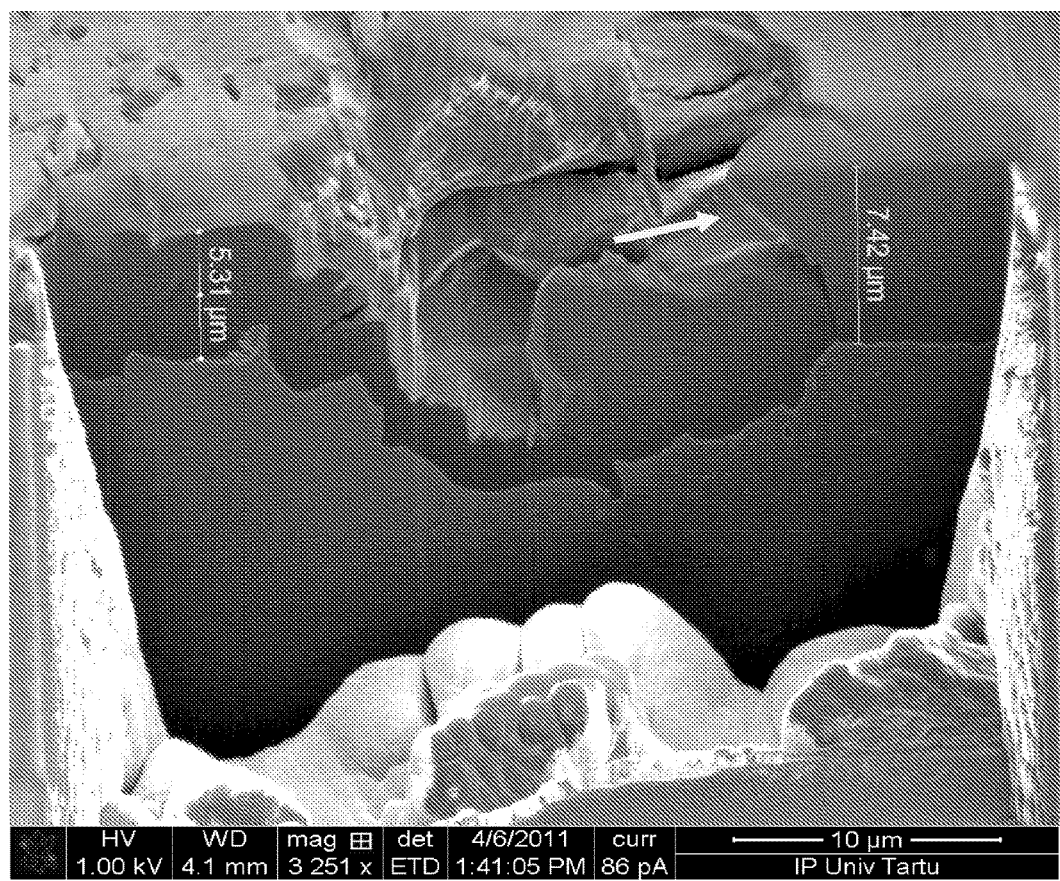
FIG. 4 is a SEM cross-section image showing cracks in a several micrometers thick anodized layer that are reaching to the bare metal substrate (see arrow).

In the second step of the anodizing process a homogeneous subsurface layer of metal oxide is formed whereas the near surface laying inclusions of other phases are dissolved or removed. In the final step of the anodizing process a nanoporous near surface structure is formed that is increases adhesion of the following ALD film(s). The method recommends the use of a three-electrode bath for carrying out the anodizing process which allows for more exact drive and control of the process than a traditional two-electrode electrochemical bath does. FIG. 3 shows such an arrangement, where the third, reference electrode (III) is used to make more precise measurements of anodizing potentials etc. The anodizing process produces a thin but dense anodic layer on the metals surfaces.

The ALD top layer passivates all of the anodized surface with chemically more resistive material(s), in addition sealing the walls down to bottom of the pores and cracks, also these reaching or going to proximity to the metallic substrate, therefore bettering the chemical resistance and mechanical properties (mainly by filling bottom areas of cracks and of small-radius pores) of the whole coating. Thus, the ALD is used for improving and finishing the topmost part of the coating. Said ALD coating is carried out a) at the temperatures not exceeding values where the mechanical properties of the substrate will be affected such as special thermal treatment(s) of the metallic substrates, e.g. 160° C. for $Al_2O_2$ alloys, b) with the growth pulsing times in the ranges (0.01-300)-(0.01-500)-(0.01-300)-(0.01-500) s, or longer for special applications, for the first precursor, purge, second precursor and purge, respectively, for gas pressure and flow rate values that ensure stable growth of the film(s) into the walls of the pores in their whole length, c) using the ALD precursors and by necessity additional reaction activators, e.g. plasma, light/radiation, temperature/pressure variations etc., allowing to get sealing films/laminates consisting of chemically resistive enough material(s), e.g. but not limited with, oxides, nitrides, carbonates, carbides etc. or their mixes or laminates, laminates with ceramic and metallic layers, laminates with inorganic or organic polymers and ceramic layers etc., having also necessary hardness and elasticity and additionally functionalizing the surfaces, if needed.

Examples of precursor gases for ALD of alumina layers include, e.g. but not limited with, TMA (trimethylaluminum), aluminum ethoxide, aluminum tri-ethoxide, aluminum isopropoxide, tri-isopropoxyaluminum, etc., and water vapors. For preparation of titania layers the titanium precursors can be, e.g. but not limited with, titanium tetrachloride ($TiCl_4$), titanium tetraisopropoxide (TTIP), etc. The oxygen precursor, water, can be replaced with hydrogen peroxide, pure oxygen or ozone in both mentioned processes; even alcohols and other organic/inorganic compounds consisting oxygen could be used. However, there is actually no oxidizing going on in the ALD processes—it is a classical exchange reaction that does not change the valence number of the metal.

The whole thickness of the coatings does not exceed one micrometer, supporting reaching necessary sealing, hardness and elasticity of the coating and at the same time allowing using them for coating the details needed maintain their exact dimensions.

In the FIG. 1. is shown a composite coating preparation steps where: a) is initial surface, b) is surface after anodizing and c) is surface after finishing with ALD. The article standard pre-cleaning before its anodizing may be needed if the article surface is not clean enough.

Figure 5:
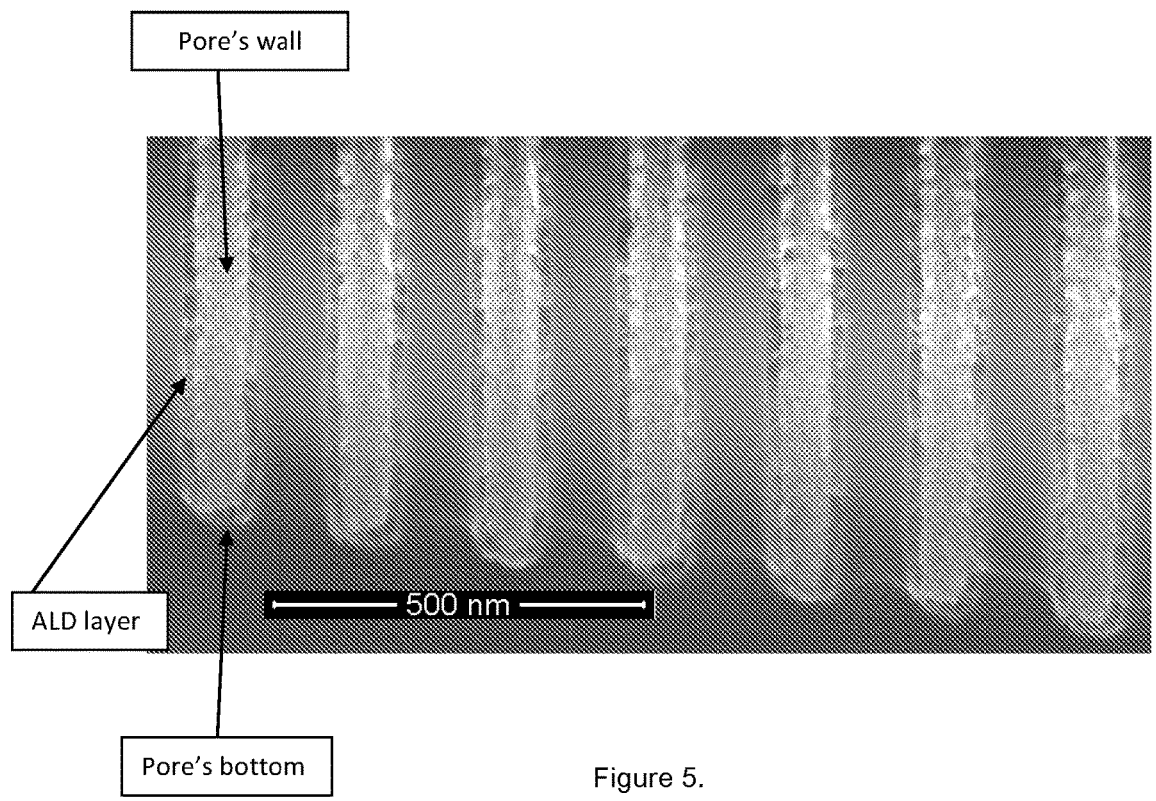
FIG. 5 is a SEM cross-section image of the bottom part of an array of deep but narrow pores demonstrating excellent coverage of inner walls of the pores with an ultrathin ALD layer.
Figure 6:
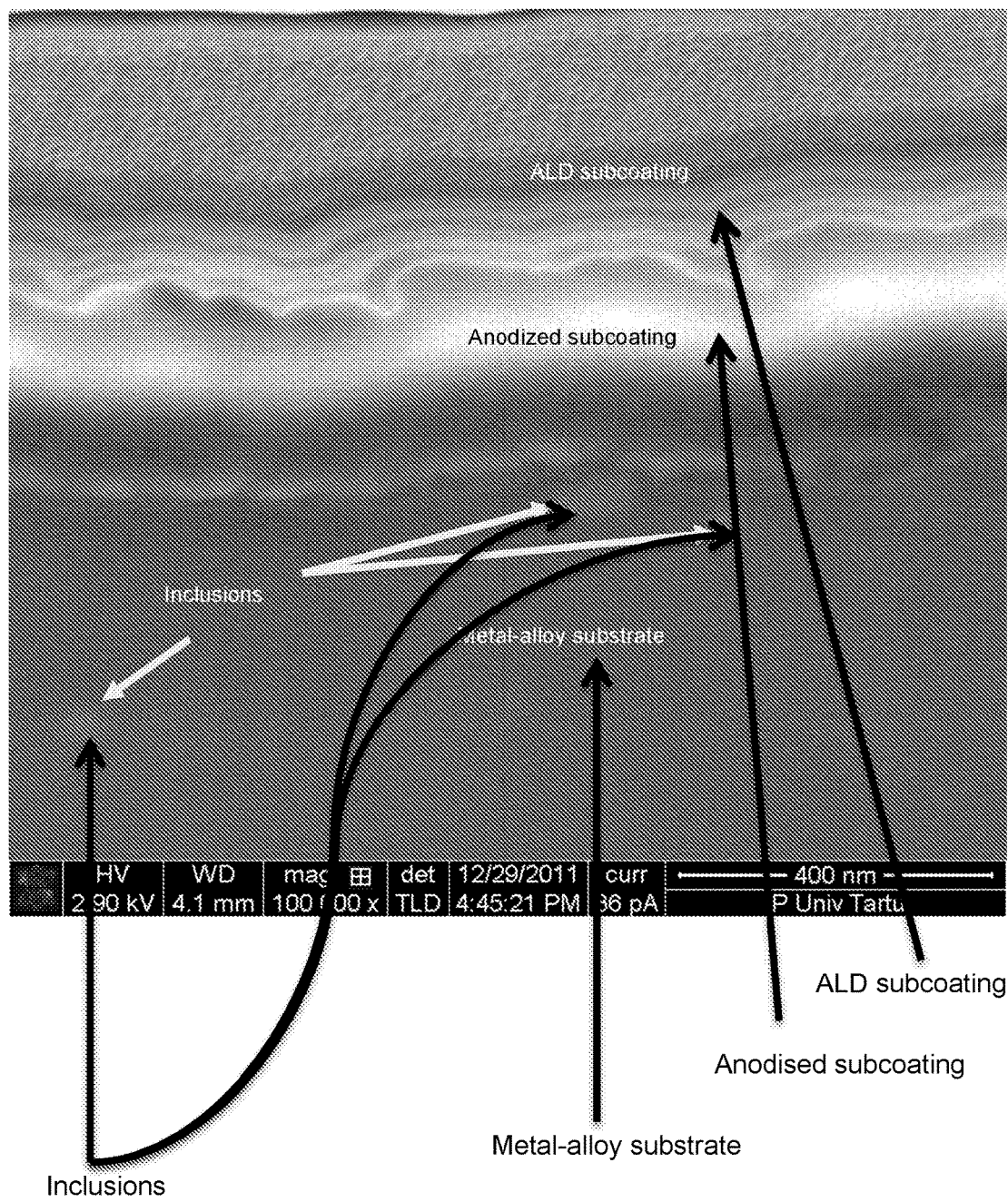
FIG. 6 is a cross-section of double-structured coatings on an Al-alloy substrate according to present invention.
Figure 7:
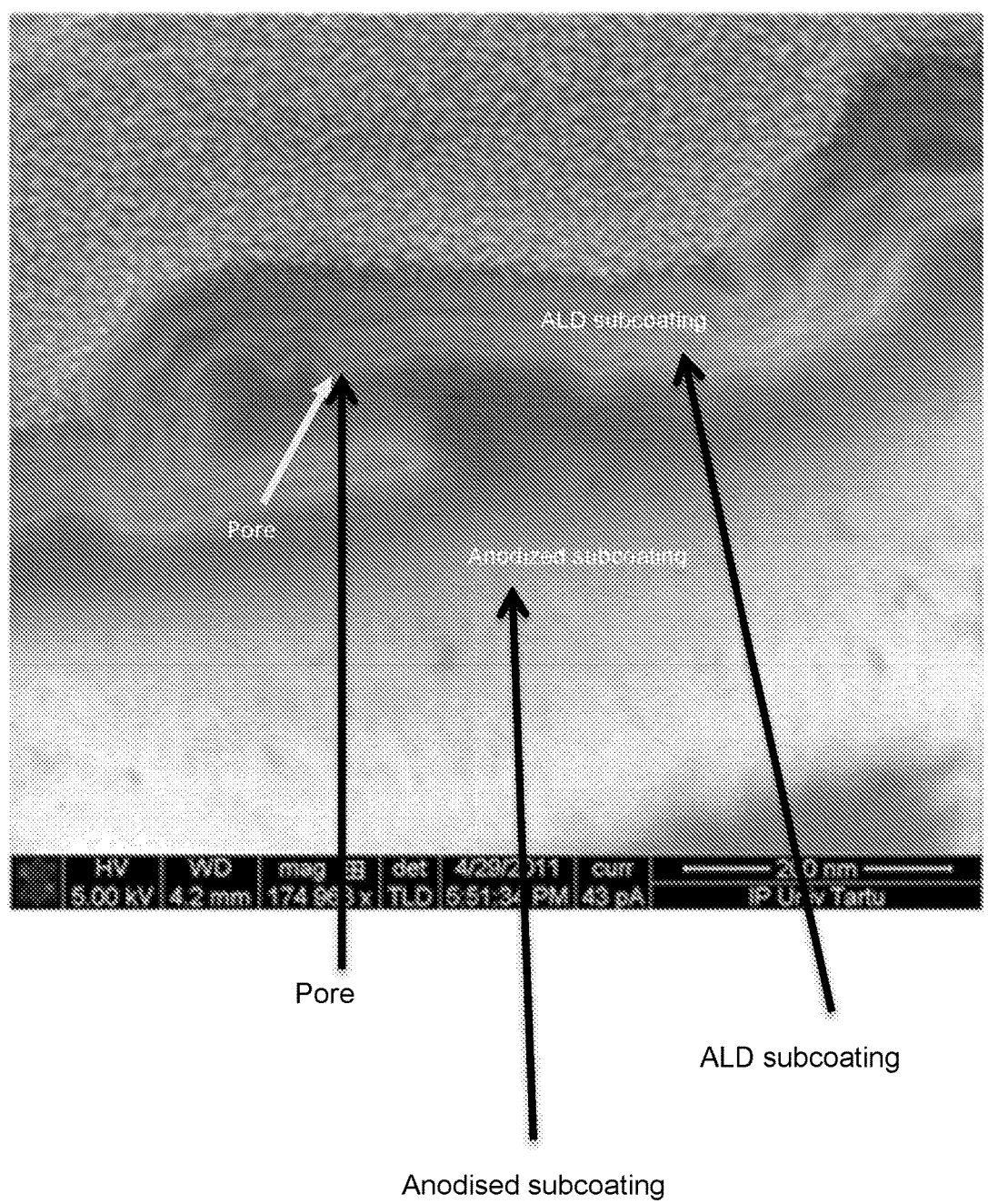
FIG. 7 is a more detailed image of a pore in anodized alumina successfully coated with an ALD laminated top-coating.

The use of the ALD process for preparation of the coatings is substantial as the method allows covering homogeneously with chemically resistive materials inner walls of micro- and nanopores and cracks up to bottom (see SEM image in FIG. 5), not only closing the pores in very surface side, as possessed by the other methods, e.g. CVD, PVD, laser ablation, etc., allowing high deposition speed but basing not on regulated surface reactions. The named latter methods leave the bottom parts of the pores uncovered by the sealing layer, thus generating potentially weak points inside the coatings. It must be added that using anodizing only it is not possible to avoid at least some pores reaching the metal part of the substrate, as during the anodized layer formation electrical path to the metal must be open. Also used other method of post-sealing the pores, e.g. treatment of the samples with hot water, are not effective, as forming during this process metal hydroxides have bigger volume than oxide and lead to generation of cracks in the layer. Contrarily, during the ALD process at elevated temperatures part of the hydroxides in anodized layer is converted into the harder and chemically more resistive metal oxides bettering the whole coating quality.

The coating preparation technology introduction in industry may need inspection and analysis of some coatings structure with a scanning electron microscope (SEM) and/or with an analytical scanning transmission electron microscope (STEM); this may be needed also if the ALD subcoating materials or its structure is changed.

The immediate applications of the surface coating according to the present invention can be in: a) aero-space industry, b) car-industry, and c) medical implants and instruments producing industries. Other potential applications can be in: metal industry producing equipment, tools and aid for chemical and food industries, for (sustainable) energetics, for building industry, etc.

Anti-corrosion/corrosion preventing/corrosion resistive/corrosion protection coating, anodizing/anodizing cell/bath, atomic layer deposition (ALD), atomic layer epitaxy (ALD), thin film/thin coating, laminate/nanolaminate, oxide-, nitride-, polymer-, metal-, ceramic-, composition-, hybrid-, double-structured-, nanostructured coating.

The anti-corrosion/corrosion preventing/corrosion resistive/corrosion protection coatings described above may include in the topcoating prepared by ALD sublayers from: oxides for example but not limited with, aluminum-, titanium-, vanadium-, zirconium-, niobium-, tantalum-, hafnium-, scandium-, magnesium-, silicon-, chromium-, molybdenum-, copper-, ruthenium-, silver oxide; nitrides for example but not limited with, aluminum-, titanium-, vanadium-, zirconium-, tantalum-, hafnium-, chromium-, molybdenum-, silicon nitride; from calcium compounds for example but not limited with, calcium carbonate, hydroxylapatite; from polymers for example but not limited with, polysilanes, polysiloxanes, polysilazanes; from carbides for example but not limited with, aluminum-, titanium-, vanadium-, zirconium-, tantalum-, hafnium-, chromium-, molybdenum-, silicon carbide; but also mixes, laminates, composites, hybrids and other (nano)materials of listed above compounds.

Ceramic materials are produced through amorphous mixed oxide layers.

Measurement and testing of corrosion resistance, adhesion and mechanical hardness of the coatings described above may be carried out with the following but not limited methods, of immersion into different corrosive solutions or gases, or spraying with them the metal article with the coating for a reasonably long period; of scratching the coating following immersion in different corrosive solutions or gases, or spraying with them, the metal article with the coating for a reasonably long period; of testing the delamination the coating from the article with sticky tapes of various sticking character; of testing the local hardness of the coating with micro and/or nano hardness testers; of characterizing the samples before and after the tests listed above with optical- and/or electron microscopy of reasonably high resolution, and with other physical-chemical, including electrochemical analysis methods.

Immersion test in 5% salt solution showed coating prepared using the above method to withstand at least 500 hours. Adhesion for Camry electrochemical sticky tapes was excellent. Micro-hardness testing showed enhancement of hardness of the double layer coatings compared to the anodised coatings only.

The invention provides a novel thin (≤1 μm) double-structured anti-corrosion coating were the base sublayer is prepared by anodizing the substrate, therefore consists of metal oxide(s) and hydroxide(s). The top sublayer of the coating, prepared by an atomic layer deposition method, consists of one or more nanolayers with total thickness of some tens of nanometers, thus it is not significantly changing the dimensions of the article. The top sublayer is made from inorganic chemically resistive material(s) making the whole coating chemically resistive and also thermally stable. A nanolayer in this context is a layer of material, which thickness is ≤0.1 μm.

The method of preparing the thin corrosion resistant coatings on the anodizing metal substrates in the present invention is substantially determined by the possibility to anodize the surface of the metal articles as well as by the need of sealing of arbitrary shaped pores existing inside the anodized sublayer because these are potential defects in the coating as the pores could cross the whole sublayer. For the sealing of the pores the ALD method suits well due to its basing principles, thus the method comprise the following steps of (see FIG. 1):

a) anodizing the surface of the metal substrates to produce a thin base sublayer naturally well adhered to the metal substrate. With certain parameters of the process the prepared sublayer can be made thin, homogeneous and dense having low concentration of pores and cracks, thus, being relatively hard. Thickness up to one micrometer of the layer provides the certain mechanical flexibility of the coating; and b) performing ALD with certain process parameters to the anodized subcoating to add nanometric toplayer that is strongly (chemically) bonded to the oxide/hydroxide base sublayer and covers that layer uniformly, including existing in anodic sublayer three-dimensional network of pores, thus seals the anodic sublayer ideally and makes the coating fully defect free.

The use of ALD method is for the sealing the pores in the anodic sublayer. As the ALD method is based on surface reactions and is limited with adsorption of the precursor molecules into the surface it can assure the homogeneous coverage of the whole surface including the walls down to bottom of the pores and cracks even when they are long and narrow and have complicated 3D geometry. The other physical and chemical deposition methods like PVD, CVD, magnetron sputtering, laser ablation, FCAD, HIPIMS, etc. have tendency to cork narrow pores and cracks near their opening or not to cover non-straight part of them rather than cover their walls homogeneously. The corking as well as partly uncovering of the defects in the protective coatings is highly unwanted as small scratches or gaps may expose the uncovered pore or crack to corrosive products.

A method for preparing thin double-structured composite corrosion resistant and/or passivating coatings that consist of a thin metal oxide-hydroxide subcoating prepared by anodizing the metal substrate materials near-surface part and then provided with an atomic layer deposition (ALD) topmost nanocoating, of e.g. oxide, nitride, carbonate, carbide etc. or their mixes or laminates, of laminates with ceramic and metallic layers, of laminates with inorganic or organic polymers and ceramic layers.

The invention claimed is:

1. A method of forming a coating on a metal article, wherein the coating is for protecting the underlying metal article against materials that are corrosive to the metal, the method comprising the steps of:
  a) anodizing the surface of the metal article by applying a voltage to the metal article, wherein the voltage parameters used for anodisation are selected to homogenise the surface layer, to produce a subcoating on the substrate, by performing the anodizing step in two stages; a first anodizing stage where an electric potential is applied to the substrate for homogenization of the surface layer and a second anodizing stage where an electric potential is then applied to the substrate to form a protective sublayer, wherein the electric potential during the first anodizing stage is varied according to a first voltage profile which includes an increasing potential between 0 and 2 Volts, wherein the potential during the second anodizing stage is varied according to a second voltage profile which includes an increasing potential between 0 and 20 Volts, wherein pores are formed during both of the first and second anodizing stages that are irregular tortuous branched cracks that reach through to the underlying metal article,
  b) depositing by atomic layer deposition (ALD) on the anodized subcoating to add a top-layer of a second material which is not corroded by materials that would corrode the underlying metal article, such that the entire surface is covered by the second material including the walls down to the bottom of the irregular branched pores even when they are long and narrow and have a complicated 3D geometry but without closing or corking the pore's openings to protect from dissolving the underlying anodised layer by preventing materials that would otherwise corrode the underlying metal article from reaching the underlying metal article.

2. A method according to claim 1, wherein the potential during the first anodizing stage is increased at a rate of between 1 to 50 mV/s.

3. A method according to claim 1, wherein the first voltage profile is repeated for 1 to 50 cycles.

4. A method according to claim 1, wherein the potential during the second anodizing stage is increased at a rate of between 0 and 100 mV/s.

5. A method according to claim 1, wherein the second voltage cycle is repeated for 1 to 100 cycles.

6. A method according to claim 1, wherein the electrolytes solution used during the anodizing step is of 0.1-80% concentration of acid.

7. A method according to claim 1, wherein said acid includes inorganic and/or organic acids including sulphuric, boric, phosphoric, tartaric, oxalic acids and/or mixtures of said acids in water or any other suitable liquid.

8. A method according to claim 1, wherein the anodizing is carried through in a three-electrode electrochemical/anodizing bath for monitoring the process with voltammetry.

9. A method according to claim 1, wherein the atomic layer deposition process is performed in a suitable system and includes exposing the substrate to a first precursor gas, purging the first precursor gas from the system, exposing the substrate to a second precursor gas and purging the second precursor gas from the system and maintaining the substrate at a temperature below the temperature at which the mechanical properties of the substrate are changed.

10. A method according to claim 9, wherein the substrate is exposed to the precursor gases for a period of time in the range 0.01 seconds to 300 seconds.

11. A method according to claim 9, wherein the system is purged of precursor gases for a period of time in the range 0.01 seconds to 500 seconds.

12. A method according to claim 9, wherein additional reaction activators are used where said activators include plasma, light/radiation or electric/magnetic fields, temperature or pressure variations for sealing the subcoating with at least one film coating.

13. A method according to claim 1, wherein the metal article is formed of a metal selected from the list consisting of: aluminum, magnesium, titanium, vanadium, zinc, niobium, cadmium, hafnium, tantalum and their alloys, and the base part of the coating is formed from an anodised layer of the metal article.

14. A method according to claim 1, wherein the atomic layer deposition process is repeated to produce a top-layer comprising a plurality of laminated layers.

15. A method according to claim 1, wherein the top-layer atomic layer deposited coating comprises at least one layer of material selected from a list consisting of: oxides selected from the list consisting of: aluminum-, titanium-, vanadium-, zirconium-, niobium-, tantalum-, hafnium-, scandium-, magnesium-, silicon-, chromium-, molybdenum-, copper-, ruthenium-, silver oxide; nitrides of aluminum-, titanium-, vanadium-, zirconium-, tantalum-, hafnium-, chromium-, molybdenum-, silicon nitride; and calcium compounds selected from the list consisting of calcium carbonate, hydroxylapatite; polymers including polysilanes, polysiloxanes, polysilazanes; carbides of, aluminum-, titanium-, vanadium-, zirconium-, tantalum-, hafnium-, chromium-, molybdenum-, silicon carbide, ceramic material produced from an amorphous mixed oxide layer.

* * * * *